United States Patent [19]

Friedman et al.

[11] 3,945,826

[45] Mar. 23, 1976

[54] METHOD OF CHEMICAL MACHINING UTILIZING SAME COATING OF POSITIVE PHOTORESIST TO ETCH AND ELECTROPLATE

[76] Inventors: Howard Friedman, 9321 W. Menard, Morton Grove, Ill. 60053; David W. Levinson, 1362 Lee Road, Northbrook, Ill. 60062; Morris H. Millman, 8737 Keeler, Skokie, Ill. 60076

[22] Filed: June 17, 1974

[21] Appl. No.: 480,247

Related U.S. Application Data

[63] Continuation of Ser. No. 244,162, April 14, 1972, abandoned.

[52] U.S. Cl. ................... 96/36; 96/35.1; 96/36.2; 156/8; 156/13; 204/32 R
[51] Int. Cl.² .................... G03C 5/00; B29C 17/08
[58] Field of Search ............... 96/35, 35.1, 36, 36.2; 204/24, 32, 45; 156/11, 8, 13

[56] References Cited
UNITED STATES PATENTS

| | | | |
|---|---|---|---|
| 3,192,136 | 6/1965 | Reid | 96/36 |
| 3,423,261 | 1/1969 | Frantzen | 156/11 |
| 3,424,658 | 1/1969 | Norton | 96/36.2 |
| 3,522,085 | 7/1970 | Watanabe | 96/36.2 |
| 3,551,150 | 12/1970 | Woodward et al. | 96/36 |
| 3,567,506 | 3/1971 | Becardi | 96/36.2 |
| 3,567,593 | 3/1971 | Burlingame | 204/24 |
| 3,666,549 | 5/1972 | Rhodenizer et al. | 96/36.2 |
| 3,700,443 | 10/1972 | Reimann | 96/36.2 |
| 3,725,215 | 4/1973 | Uchytil | 96/36.2 |
| 3,782,939 | 1/1974 | Bonham et al. | 96/35.1 |

*Primary Examiner*—Edward C. Kimlin
*Attorney, Agent, or Firm*—Mann, Brown & McWilliams

[57] ABSTRACT

A method of chemical machining utilizing selective plating techniques to form a metal component from sheet metal sheets, in which each sheet is degreased, rinsed in deionized water, and thoroughly dried, then is coated with a positive photoresist. The photoresist is cured, and then the image of the component to be formed is photographically applied to either side of the sheet utilizing photomasks, the photographically exposed photoresist is removed from the sheet, and the sheet etched to provide the basic component configuration. Selective plating is effected by further photographically exposing the photoresist of the sheet that overlies the portions of the sheet to be plated, by utilizing photomasks delineating the areas to be plated, after which the freshly exposed photoresist is removed, the sheet baked to better condition the resist for plating, and then suitably electroplating the areas of the sheet metal thus exposed. After plating, the completed component is soaked in acetone to remove the resist.

9 Claims, 3 Drawing Figures

METHOD OF CHEMICAL MACHINING UTILIZING SAME COATING OF POSITIVE PHOTORESIST TO ETCH AND ELECTROPLATE

This application is a continuation of our application Ser. No. 244,162, filed Apr. 14, 1972, now abandoned.

This invention relates to a method of chemical machining utilizing selective plating techniques, and more particularly, to a method of forming products from sheet metal utilizing photofabrication techniques that make provision for plating the product as little or as much as desired.

Photofabrication is the process of forming products from sheet metal by chemical etching with the shape of the desired part determined by photographic masking techniques. Photofabrication techniques are also known as chemical milling, photoforming, chemical cutting, photoetching, photo-mechanical duplicating, and chemical machining. While basic photofabrication or chemical machining techniques are well known, prior to this invention, plating of the resulting products, where desired, has followed completion of the etched product and after the photoresist that has been used in making the etched product has been removed. This means that the areas of the etched product which are not to be plated had to be somehow covered or masked to insure that the plating was applied only where desired, with the consequent difficulties attended therewith in light of the special shapes and configurations that are usually encountered in practicing photofabrication techniques.

A principal object of this invention is to provide a method of chemical machining utilizing selective plating techniques in which the photoresist remaining on the etched product after etching is used in conjunction with photomasks to delineate on the product those areas to be plated to facilitate the baring of only those parts of the products that are to be plated and provide a plating resisting coating for other parts of the product.

Another principal object of the invention is to provide an improved method of chemical machining that insures a high quality product with precise tolerances at low cost.

Yet other objects of the invention are to employ the special qualities of positive photoresist to condition photofabricative parts for selective plating as desired, to especially condition the material being chemically machined and its photoresist coating for improved photofabrication and selective plating results, and to provide methods of phorofabrication production that are economical to practice and are applicable to a wide variety of materials and part configurations, with precise tolerance maintenance.

In accordance with this invention, the metal sheeting forming the raw material is degreased and chemically cleaned, after which positive photoresist is applied thereto and the sheet is baked to cure the resist. The basic configuration of the end product is delineated on the sheet by applying the sheet between photomasks bearing registered images of the part of component to be etched (usually a number of such parts are formed from each sheet, and consequently the photomasks bear registered repeated images of the part in question). The photomasks and sheet are then exposed to a source of high intensity light, after which the sheet is disassociated from the photomasks, and is immersed in a resist solvent to remove the exposed photoresist. The sheet is then etched, rinsed, and dried, and prepared for selective plating by applying photomasks thereto which delineate the areas to be plated. Exposure to light is then made, the photomasks removed, and the sheet immersed in resist solvent to remove the thus photographically exposed reist. The sheet is then baked to better condition the remaining resist for resisting plating, after which the plating of the then bared areas of the sheet is effected by a suitable electroplating process. Where other areas of the product are to be plated with a different material, resist covering such areas is similarly photographically exposed and removed, and the additional plating effected in the manner indicated. When all plating is completed, the resist is removed to provide the end product.

Other objects, uses and advantages will be obvious or become apparent from a consideration of the following detailed description and application drawings.

However, it is to be understood that the specific drawing illustrations provided are supplied primarily to comply with the requirements of the Patent Code, and that the invention may have other embodiments which will be obvious to those skilled in the art, and which are intended to be covered by the appended claims.

Figure 2:
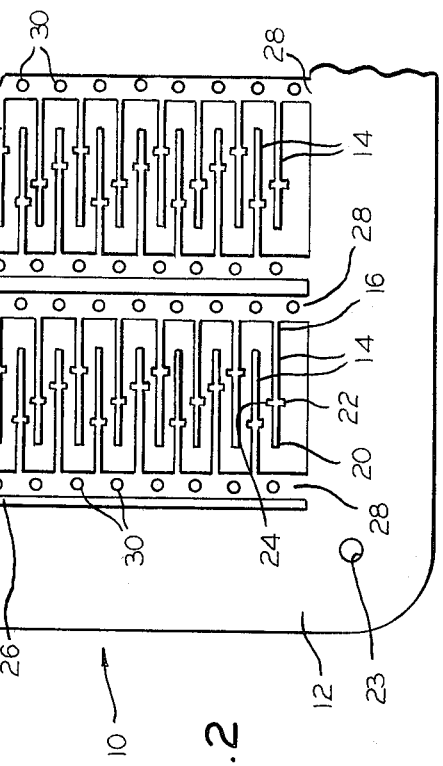
FIG. 2 is a diagrammatic fragmental plan view illustrating a portion of a sheet that has been processed in accordance with this invention to provide a selectively plated end product.

Reference numeral 10 of FIG. 2 diagrammatically illustrates one corner of a lead frame or microswitch circuiting made in accordance with this invention that is made from a sheet 12 formed from copper or the like that has been chemically shaped to define a plurality of lead elements 14 that are to be apapted into the circuiting, as by employing a suitable thermocompression bonding technique, or some other convention procedure that is known to the art. For handling purposes, subsequent to completion of frame 10 in accordance with this invention, the lead elements 14 have one end 16 thereof remaining connected to a connecting strip 18 of the sheet 12 while the other end 20 is free from the sheet. In the particular form of lead element 14 that is illustrated, the individual lead elements each include a pair of opposed projections 22 and 24 adjacent the element end 20.

The lead frame 10 is of more or less conventional configuration, with strips 18 being separated from the sheet 12 as at 26, except at their ends 28, and strips 18 are formed with a plurality of spaced alignment holes 30 for conventionally aligning the lead elements 14 in the circuiting during the procedure of applying the lead elements to the circuiting. During this procedure, lead elements 14 are separated from the strips 18 and strips 18 are removed.

In the particular lead frame 10 that is illustrated, the lead elements and their associated connecting strips 18 are not only formed or shaped by the procedures of this invention, but also the lead elements 14 may be selectively plated. In the form shown, leads 14 are plated on both sides of same between their ends 16 and 20, with the connecting strips 18 remaining unplated as well as the remainder of sheet 12.

Frame 10 is of generally quadrilateral configuration (only one corner of same is shown in FIG. 2) and at each of its corners 21 it is formed with a hole or perforation 23 for sheet handling purposes.

Lead frame 10 is produced in accordance with this invention in the following manner all without any of the traditional tooling usually associated with the fabrication of metal parts.

The tooling required to form the lead frame 10 and duplicates of same is made up starting with a blueprint or detailed sketch of the part or component that is being manufactured. Art work, in the form of a master photographic template, is made up, which consists of a drawing on an oversized scale that is suitable for the part being manufactured. The template material ordinarily is an opaque plastic, usually composed of an opaque lacquer film laminated to a transparent polyester film, an example of which is the No. 75 DM product made and sold by Ulano, Inc. under the trademark Rubylith. The drawing is made by utilizing a coordinatograph to scribe through the opaque layer of the laminate in a conventional manner to provide an image of the part to be fabricated. In practice the part is shown on the order of ten times its desired size. The metal to be removed is represented by the scribed portions of the template.

The template or art work is then photographically reduced to final size through one or more exposures to provide an image on a film. Since ordinarily it is desired to make a number of duplicates of the part from the same sheet of metal, the resulting film is then applied to a suitable type of step and repeat machine to form images on another sheet of film in multiples arranged in the manner that the parts are to be formed in the sheet 12 (with the positioning involved that is best suited for economical use of the base metal sheet). The resulting film or transparency forms one of the photomasks to be employed in accordance with this invention, and the second photomask is formed by aligning and registering the first photomask with another sheet of film that is to form the second photomask, with the photomasks together in emulsion to emulsion, and exposing the second photomask to the source of light through the first photomask to form the same image on the second photomask, which is then developed for masking purposes.

In this connection, it is pointed out that glass plates can be used in place of film to form the photomasks. Also, the films or plates forming the photomasks are suitably formed to be properly aligned and registered with each other and this may be done in any conventional manner. In the case of films, the use of Aldis pins in a suitable frame is recommended.

At this point, the tooling is now completed in the form of a pair of photomasks, one to be applied to one side of the plate to be etched and the other to be applied to the other side of the plate. In both photomasks, the portion of the metal to be etched is transparent while the portion of the metal to be retained is represented by the opaque portions of the masks.

The tooling represented by the photomask is of a permanent nature and may be stored for repeated use.

The production procedure utilizing the tooling described involves the cutting of metal sheeting to the desired working size, which in practice may provide a sheet 12 of quadrilateral configuration measuring approximately thirteen inches by fifteen inches, although these sizes may vary depending on production facilitates available and production requirements to be met.

The sheet 12 may be formed from a wide variety of materials, such as copper, Kovar, nickel, steel, Ni silver and other cooper base alloys as well as other metals that can be plated. The particular lead frame 10 illustrated is formed from copper sheeting.

Figure 1:
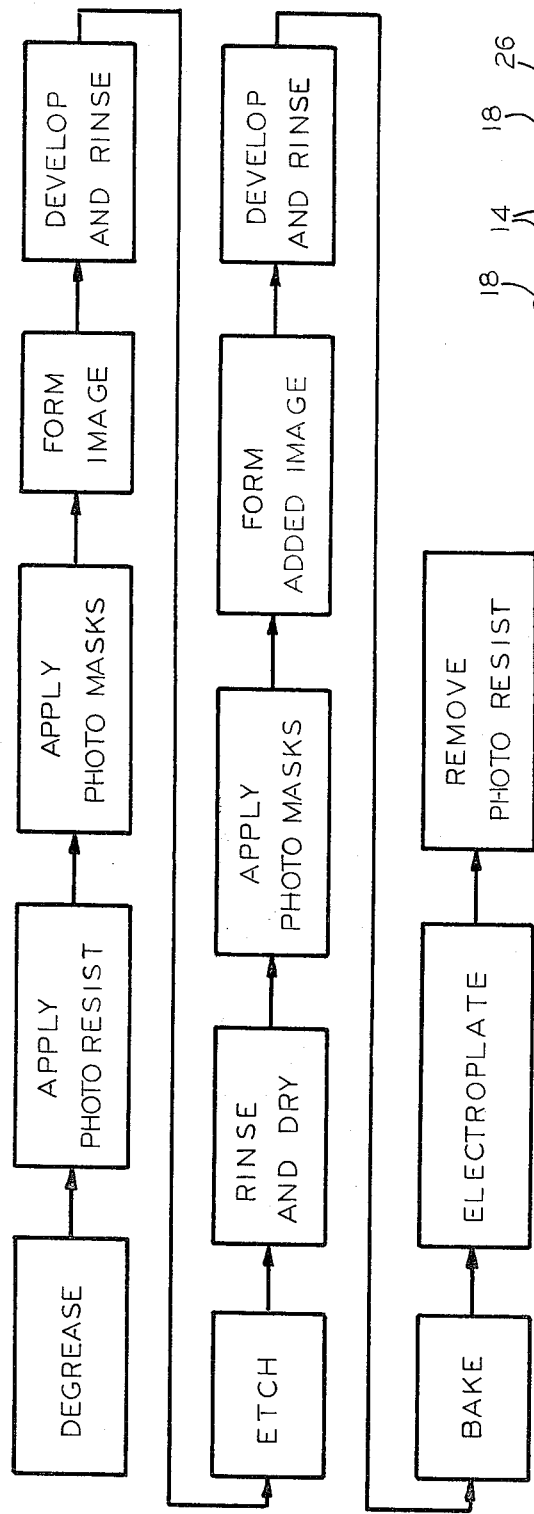
FIG. 1 is a flow sheet illustrating the process of this invention.
Figure 3:
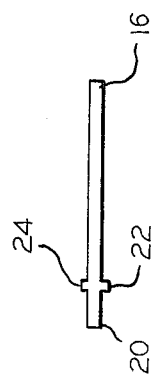
FIG. 3 is a plan view on an enlarged scale of one of the end product components made from the sheet shown in FIG. 2.

The sheet 12 after it is formed to size is processed in the manner illustrated by the flow sheet of FIG. 1. The sheet 12 is first degreased in a suitable vapor degreaser (such as the Little Corporal model made by Detrex Chemical Industries Inc.) using trichlorethylene as the solvent, after which the plate is immersed in an aqueous solution of 10 per cent hydrocholric acid at room temperature for approximately five minutes, after which the plate is thoroughly rinsed in deionized water to insure removal of all mineral residuals, grease residuals, and other foreign matter that might still remain even after the chemical cleaning provided by the acid bath. The plate is then dipped into a bath of isopropyl alcohol to insure even drying without water spotting, and then placed in an oven to evaporate the alcohol and any remaining water on the surface of the sheet to complete the sheet surface preparation.

The chemical cleaning and other processing that are involved after degreasing effects a conditioning of the surface of the sheet 12 for the type of photoresist adherence that is contemplated by this invention.

The sheet is then dipped into a suitable positive type photoresist, such as the product sold under the trademark AZOPLATE, designation AZ-345, by Shipley Company, Inc. of Newton, Massachusetts. Any suitable positive-acting photoresist material will suffice. In practice the plate 12 is applied to an apparatus in which the plate is dipped into and out of a bath of the photoresist material and at a controlled rate on the order of 12 inches per minute.

In this prodcedure of the invention, it is preferred that the photoresist be mixed with 10 per cent of a suitable thinner, such as Shipley's H2-345 photoresist thinner.

After the photoresist is sufficiently dried on the plate, the plate is suitably baked to insure the photoresist and drive off solvents. In practice the sheet is placed in an infrared oven regulated to maintain surface temperature near but below 200° F. Curing time is approximately 10 minutes under these conditions.

The cured photoresist is photosensitive and acid resistant (it being a polymerized material) although in liquid form the photoresist is not light sensitive. The thickness of the photoresist coating is controlled by the rate of withdrawal from the photoresist bath; the faster the withdrawal rate, the thicker the coating of photoresist. While dipping is the preferred way of applying the photoresist to plate 12, application may also be done by spraying, spinning or any other convenient means.

The coated sheet 12 is then placed between the two previously prepared photomasks, and this is done by applying the sheet and masks to a suitable frame in which the sheet and masks are registered for precise alignment. This may be done in any suitable manner. Both sides of the sheets are then exposed to a high intensity light source under conventional vacuum techniques which draw the photomasks into firm contact with the sheet 12, with the result that the photoresist coatings of the sheet are exposed through the areas of the photomasks that are transparent. Suitable light sources are ultraviolet lamps or mercury vapor lamps.

The average exposure time is 30 seconds to 3 minutes, depending on the nature of the photoresist and product configuration that is involved.

After exposure, the sheet is removed from between the photomasks and is immersed in a suitable positive photoresist developer, such as the alkaline developer product sold under the trademark AZOPLATE, designation AZ-303, by Shipley. The exposed portions of the photoresist are soluble in the photoresist developer and thus this step of the process dissolves the photoresist that has been photographically exposed. It is to be noted that the remaining photoresist is still photo-sensitive but nonsoluble in the developer. Development is at room temperature with an immersion time of approximately 3 minutes, after which the sheet is rinsed in tap water.

The sheet 12 is now in condition to be etched, and in practice a spray etching machine is used to etch the sheet from both sides, with the spray being applied to both sides of the sheet utilizing Ferric chloride as the etchant. Etching machines of two types may be employed, that is, a batch type which etches one sheet at a time, or a conveyor type which etches sheets continuously. In any event, the sheet 12 is preferably etched at 42 Be' to 48 Be' acid concentration, at temperatures in the range of from about 110° F. to about 135° F., with the sheet moving at a rate of about 12 inches per minute through the spray. The etching results in the formation of the basic configuration of the end product, with all the metal which is bare of photoresist having been removed by the microscopic electrochemical cell action that occurs in corrosion or chemical dissolution of metal pursuant to conventional etching procedures.

After etching, the sheet 12 is rinsed and allowed to dry at room temperature. The sheet 12 is now in condition for application of the selective plating techniques of this invention.

In practicing the selective plating techniques of this invention, photomasks are prepared which delineate the areas of the plate 12 that are to be plated. For instance, since the lead elements 14 are to be plated between their ends 16 and 20, and on both sides of same, including the projections 22 and 24, two photomasks are required that are of the same general type previously prepared for the basic tooling except that the transparent areas represent that areas of the plate 12 to be plated. In other words, the photomasks for practicing the selective plating techniques of this invention in connection with the plate 12 would be formed with clear areas the size and outline of lead elements 14, for each lead element 14 to be plated on both sides of same. The plate 12 and the photomasks are brought together and registered in any suitable manner to bring the images of the lead elements into registry with and on either side of the lead elements 14 that are to be plated.

Of course, if only one side of the lead elements 14 are to be plated, then only one photomask is used; and if only some or parts of the lead elements are to be plated, the masks are appropriately made up for this purpose.

The sheet 12 is then exposed to a suitable source of high intensity light of the type described earlier through the photomask or photomasks that have been applied to same, and under the vacuum conditions that have been previously referred to. The time of exposure will be from 30 seconds to 3 minutes, again depending on the nature of the photoresist used and configuration of the metal parts being selectively plated.

The plate 12 is then removed from the photomasks and again applied to a suitable positive photoresist developer, such as that aforereferred to. Again, immersion time is approximately 3 minutes and after development the sheet 12 is rinsed in tap water. This step effects removal of the positive photoresist from the lead elements 14 to be plated.

The sheet 12 is now exposed to a source of heat that will provide a surface temperature of approximately 250° F. to approximately 300° F. for a period of approximately 10 minutes. In practice this is done by using an infrared oven. This step is performed, in accordance with this invention, to better condition the remaining photoresist to hold up during the plating process that is to follow.

Thereafter, the sheet 12 is immersed in a suitable cleaning solution, such as a ten per cent hydrochloric acid aqueous solution, to prepare it for plating. The sheet is then applied to conventional electroplating equipment to effect plating of the lead elements 14. This is done by suspending the plate 12 in the usual tank containing a suitable electrolyte appropriate for the material being plated. A source of the material being plated and the plate 12 are connected in the usual plating circuiting, whereby molecules of the plating material become deposited on the lead elements 14. Since the elements 14 are no longer covered with photoresist, they are plated, but the remaining portions of the plate 12 that are covered with photoresist are not plated due to the plating resisting character of the photoresist.

In this connection, the plating material employed may be of any suitable type, such as gold, nickel, or any material adapted for plating procedures.

Furthermore, different portions of the lead elements 14 may be selectively plated as may be required by special applications. For instance, the end 20 of the lead elements 14 may be plated with nickel, then subsequently the projections 22 and 24 plated with hard gold, and then subsequently the ends 16 of the lead elements plated with citrate gold, by repeating the selective plating masking, photographic exposure, resist removal, and baking steps previously described, in a desired sequence. The photomasks, of course, are suitably formed to define the areas of the plate 12 that are to be photographically exposed for photoresist removal and plating purposes, with registration of the plate 12 and the plating mask or masks, as the case may be, being effected in any suitable manner.

In this connection, the edges of plate 12 that are defined by openings 26 and the space between leads 14 will also tend to plate as they are not covered with photoresist. However, this does not effect the end product desired and the thickness of the plate 12, which ordinarily will lie in the range of between 0.005 inch and 0.125 inch, insures minimum waste of the plating material.

In practice, a number of sheets 12 are processed simultaneously in practicing the methods of this invention by employing suitable equipment to consecutively handle sheets 12 as required, or handle selected groups of the sheets, as required.

This invention provides the important advantages of photofabrication techniques with the additional advantage of providing for selective plating of the resulting product. The general procedure involved requires no manufacturing dies, permits design changes to be made quickly and inexpensively, and makes feasible small research and development runs. A wide variety of metals are available for use in practicing these procedures, and design configurations that can be accommodated are practically limitless in number and type. However, the invention is concerned primarily with the manufacture of thin metal parts.

In addition to leads for microcircuits, some applications of the selective plating procedures are in connection with contact points for spring contacts, relay parts, printed circuit applications, electrical connections, precision instrument parts, strain gauges, hearing aid parts, electronic tubes, leads for thick film circuits, switch parts, decorative plaques, motor parts, watch parts, computer parts, resistors, and jewelry, among many others.

In general, any material that can be chemically dissolved and desposited by electroplating or metal evaporation can be formed into a part using photofabrication. Stainless and carbon steels, aluminums, copper alloys, and nickel alloys are commonly used for photofabricated parts.

The foregoing description and the drawings are given merely to explain and illustrate the invention and the invention is not to be limited thereto, except insofar as the appended claims are so limited, since those skilled in the art who have the disclosure before them will be able to make modifications and variations therein without departing from the scope of the invention.

We claim:

1. The method of chemical machining a sheet of sheet metal to define one or more components that have their marginal edgings formed by voids formed in the sheet but which remain integrally connected in the sheet for handling purposes, which method is to include the plating of a precious metal on selected portions of one or more of said components on restricted areas of same, said method comprising:

taking the sheet and degreasing same, chemically cleaning the sheet, rinsing the sheet with deionized water and drying the sheet, passing the dried sheet through a liquid positive photoresist to provide each side of the sheet with a positive photoresist coating of uniform thickness across the sheet, curing the photoresist coatings to make same photosensitive, placing the sheet between a set of photomasks bearing registered images of the front and back side of the metal components to be formed, respectively, photographically exposing said images to a high intensity light source to transfer the respective images to the respective coatings in registered relation by exposure of same to said light source through the respective photomasks, immersing the sheet in a positive photoresist developer to remove from the sheet only those portions of said coatings that were photographically exposed by the exposing step to bare the portions of said sheet underlying said photographically exposed portions of said coatings, etching the sheet on both sides of same to remove the bared portions of said sheet through the thickness of said sheet to form the sheet voids that define said components, rinsing and drying the etched sheet, applying to the etched sheet in registered relation thereto and in overlying registered relation to one of the coatings a photomask bearing an image delineating for exposure one or more selected areas of the etched sheet where selective plating of a precious metal is desired, photographically exposing the photomask and said one coating to a high intensity source of light to transfer to said one coating the image of the second mentioned photomask, immersing the sheet in a positive photoresist developer to remove from the sheet only the newly photographically exposed portions of the one coating to bare the portions of said sheet underlying said newly exposed portions of said coating, baking the sheet and coatings under conditions providing a surface temperature in the range of from about 250° F. to about 300° F. for about 10 minutes, cleaning the sheet in an acidic bath for plating purposes, electroplating, in an electrolyte bath of the type to which said coatings remain plating resistant, the newly bared sheet portions with the precious metal to the exclusion of the sheet portions still bearing said coatings, and thereafter removing the remainder of the photoresist coatings.

2. The method set forth in claim 1 wherein prior to removing the remainder of the phororesist coatings, the sheet is further selectively plated with another metal by, applying to the etched sheet in registered relation thereto and in overlying registered relation to one of the coatings a photomask delineating for exposure one or more further areas of the etched sheet where further selective plating is desired, exposing the photomask of the preceding step and sheet to a high intensity source of light to transfer to said one coating of the preceding step the image of the photomask of said preceding step, immersing the sheet in a positive photoresist developer to remove from the sheet the newly photographically exposed coating portions, to bare the sheet portions underlying same, baking the sheet and coatings under conditions providing a surface temperature in the range of from about 250° F. to about 300° F. for about 10 minutes, cleaning the sheet in an acidic bath for plating purposes, and electroplating the newly bared sheet portions with said other metal to the exclusion of the sheet portions still bearing said coatings.

3. The method of chemical machining a sheet of sheet metal to define one or more components that have their marginal edgings formed by voids in the sheet but which remain integrally connected in the sheet for handling purposes, which method includes selective plating of said components while they remain integrally connected in the sheet, which method is to include the plating of a precious metal on selected portions of one or more of said components on restricted areas of same, which method comprises:

taking the sheet and passing same through a trichlorethylene solvent bath, immersing the sheet in a 10 per cent aqueous solution of hydrochloric acid at approximately room temperature for approximately 5 minutes, removing the sheet from the hydrochloric solution and rinsing same with deionized water, dipping the sheet into an isopropyl alcohol bath and then drying the sheet metal, passing the dried sheet through a liquid positive photoresist to provide each side of the sheet with a positive photoresist coating of uniform thickness across the sheet, curing the photoresist coatings, placing the sheet between a set of photomasks bearing registered images of the front and back sides of the metal components to be formed, respectively, photographically exposing said images to a high intensity light source to transfer the respective images to the respective coatings in registered relation by exposure of same to said light source through the respective masks, immersing the sheet following said exposure in a positive photoresist developer to remove from the sheet only the portions of said coatins that were exposed by the exposing step to bare the portions of said sheet underlying said photographically exposed portions of said coatings, etched the sheet on both sides to remove the bared portions of said sheet through the thickness of said sheet to form the sheet voids that define said components, rinsing and drying the etched sheet, applying to the etched sheet in registered relation thereto and in overlying registered relation to one of the coatings a photomask bearing an image delineating for exposure one or more selected areas of the etched sheet where selective plating of a precious metal is desired, photographically exposing the photomask and said one coating to a high intensity source of light to transfer to said one coating the image of the second mentioned photomask, immersing the sheet after the last mentioned exposure in a positive photoresist developer to remove from the sheet only the newly photographically exposed portions of the one coating to bare the portions of said sheet underlying said newly exposed portions of said coating, baking the sheet and coatings under conditions providing a surface temperature in the range of from about 250° F. to about 300° F. for about 10 minutes, cleaning the sheet in an acidic bath for plating purposes, electroplating in an electrolyte bath of the type to which said coatings remain plating resistant the newly bared sheet portions with the precious metal to the exclusion of the sheet portions still bearing said coatings, and thereafter removing the remainder of the photoresist coatings, whereby said selected areas of said sheet are plated while said sheet bears said coatings that resist plating of the portions of said sheet remaining coated therewith.

4. The method set forth in claim 3 wherein:
the sheet is passed through the liquid photoresist at a rate on the order of 12 inches per minute.

5. The method set forth in claim 3 wherein:
the photoresist coatings are cured by heating the sheet under temperature conditions to keep the surface temperature of the sheet near but below 200° F. for approximately 10 minutes.

6. The method as set forth in claim 3 wherein:
said exposing steps are preformed with the photomasks and sheet applied to a vacuum frame under vacuum conditions.

7. The method set forth in claim 3 wherein:
the etching step is employed by utilizing Ferric chloride etchant having an acid concentration in the range of about 42 Be' to about 48 Be' at a temperature in the range of from about 110° F. to about 135° F.

8. The method set forth in claim 3 wherein:
the removal of the remainder of the photoresist coatings is effected by soaking the sheet in acetone.

9. The method set forth in claim 7 wherein:
the etchant is applied to the sheet, in practicing the etching step, by passing the sheet through a spray of the etchant at a rate on the order of 12 inches per minute.

* * * * *

UNITED STATES PATENT OFFICE
CERTIFICATE OF CORRECTION

Patent No. 3,945,826               Dated    March 23, 1976

Inventor(s) Howard Friedman, David W. Levinson and Morris Millman

It is certified that error appears in the above-identified patent and that said Letters Patent are hereby corrected as shown below:

Column 1, line 52, "phorofabrication" should read --photofabrication--; Column 5, line 47, "that" should read --the--;
Column 8, line 30, "phororesist" should read --photoresist--;
Column 9, line 21, "coatins" should read --coatings--.

Signed and Sealed this

Sixth Day of July 1976

[SEAL]

Attest:

RUTH C. MASON
*Attesting Officer*

C. MARSHALL DANN
*Commissioner of Patents and Trademarks*